(12) United States Patent
Chen et al.

(10) Patent No.: US 11,212,622 B2
(45) Date of Patent: Dec. 28, 2021

(54) PIEZOELECTRIC ASSEMBLY, ELECTRONIC DEVICE AND ASSEMBLY PROCESS FOR PIEZOELECTRIC ASSEMBLY

(71) Applicant: Beijing Xiaomi Mobile Software Co., Ltd., Beijing (CN)

(72) Inventors: Jing Chen, Beijing (CN); Chiafu Yen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/020,181

(22) Filed: Sep. 14, 2020

(65) Prior Publication Data
US 2021/0345045 A1    Nov. 4, 2021

(30) Foreign Application Priority Data

Apr. 30, 2020 (CN) .......................... 202010367109.4

(51) Int. Cl.
*H04R 17/00* (2006.01)
*H04R 1/02* (2006.01)
*H01L 41/193* (2006.01)

(52) U.S. Cl.
CPC ............. *H04R 17/00* (2013.01); *H04R 1/025* (2013.01); *H04R 1/028* (2013.01); *H01L 41/193* (2013.01)

(58) Field of Classification Search
CPC .......... H04R 17/00; H04R 1/025; H04R 1/08; H01L 41/193
USPC ........................................................ 381/333
See application file for complete search history.

(56) References Cited

U.S. PATENT DOCUMENTS

| | | |
|---|---|---|
| 2002/0067841 A1* | 6/2002 | Bank ...................... H04R 7/045 381/152 |
| 2003/0138190 A1 | 7/2003 | Tabata |
| 2018/0098139 A1* | 4/2018 | Arevalo Carreno . H04R 31/006 |
| 2019/0238995 A1* | 8/2019 | Fukuyama ............... H04R 1/00 |
| 2019/0273992 A1* | 9/2019 | Harris .................... H04R 17/00 |
| 2020/0055088 A1* | 2/2020 | Okada ................. H01L 41/1132 |
| 2020/0401777 A1* | 12/2020 | Won ..................... G06K 9/0002 |
| 2021/0144480 A1* | 5/2021 | Won ......................... H04R 9/06 |

OTHER PUBLICATIONS

European Search Report in European Application No. 20197826.9, dated Mar. 3, 2021.

* cited by examiner

*Primary Examiner* — Sean H Nguyen
(74) *Attorney, Agent, or Firm* — Finnegan, Henderson, Farabow, Garrett & Dunner, L.L.P.

(57) ABSTRACT

A piezoelectric assembly includes at least two piezoelectric components, a positive circuit board, and a negative circuit board. Each piezoelectric component includes a main body portion and a connecting portion. Respective first surfaces of the main body portion and the connecting portion are a positive electrode, and respective second surfaces of the main body portion and the connecting portion are a negative electrode. Main body portions of the at least two piezoelectric components are stacked, connecting portions of the at least two piezoelectric components are distributed in a staggered manner along a set edge. The positive circuit board is coupled to the first surface of the connecting portion, and the negative circuit board is coupled to the second surface of the connecting portion.

20 Claims, 10 Drawing Sheets

PIEZOELECTRIC ASSEMBLY, ELECTRONIC DEVICE AND ASSEMBLY PROCESS FOR PIEZOELECTRIC ASSEMBLY

CROSS-REFERENCE TO RELATED APPLICATIONS

This application is based upon and claims priority to Chinese Patent Application No. 202010367109.4, filed on Apr. 30, 2020, the entire content of which is incorporated herein by reference.

TECHNICAL FIELD

The present disclosure relates to the technical field of piezoelectric assemblies, in particular to a piezoelectric assembly, an electronic device, and an assembly process for a piezoelectric assembly.

BACKGROUND

Designs free of holes are a popular trend in current electronic devices, such as mobile phones, tablet computers, wearable devices and so on. In order to remove sound holes from the electronic device, a piezoelectric assembly brings a screen overall into vibration, to produce sound. Thus, it is necessary to provide piezoelectric assemblies suitable for the electronic devices.

SUMMARY

The present disclosure provides a piezoelectric assembly, an electronic device, and an assembly process for a piezoelectric assembly. The piezoelectric assembly is applicable to the electronic device.

In a first aspect of embodiments of the present disclosure, a piezoelectric assembly includes at least two piezoelectric components, each of the at least two piezoelectric components including: a main body portion having a set edge, a first surface, and a second surface opposite the first surface, main body portions of the at least two piezoelectric components being stacked, and a connecting portion protruding from the set edge and having a first surface and a second surface opposite the first surface, the first surface of the main body portion and the first surface of the connecting portion being a positive electrode, the second surface of the main body portion and the second surface of the connecting portion being a negative electrode, and first surfaces of connecting portions of the at least two piezoelectric components face a same direction, and the connecting portions of the at least two piezoelectric components being staggered along the set edge; a positive circuit board coupled to the first surface of the connecting portion; and a negative circuit board coupled to the second surface of the connecting portion.

In a second aspect of embodiments of the present disclosure, an electronic device includes a display screen having a back surface facing an inside of the electronic device; and a piezoelectric assembly coupled to the back surface. The piezoelectric assembly includes: at least two piezoelectric components, each of the at least two piezoelectric components including: a main body portion having a set edge, a first surface, and a second surface opposite the first surface, main body portions of the at least two piezoelectric components being stacked, and connecting portions of the at least two piezoelectric components being spaced apart along the set edge, and a connecting portion extending from the set edge in a direction away from the main body portion and having a first surface and a second surface opposite the first surface, the first surface of the main body portion and the first surface of the connecting portion being a positive electrode, the second surface of the main body portion and the second surface of the connecting portion being a negative electrode, and first surfaces of the connecting portions of the at least two piezoelectric components face a same direction; a positive circuit board arranged on the first surface of the connecting portion; and a negative circuit board arranged on the second surface of the connecting portion.

In a third aspect of embodiments of the present disclosure, an assembly process for a piezoelectric assembly includes: providing at least two piezoelectric components, wherein each of the at least two piezoelectric components includes a main body portion and a connecting portion protruding from a set edge of the main body portion, a first surface of the main body portion and a first surface of the connecting portion are a positive electrode, and a second surface of the main body portion and a second surface of the connecting portion are a negative electrode, and the first surfaces are opposite to the second surfaces; stacking main body portions of the at least two piezoelectric components to cause a first surface of one piezoelectric component of the at least two piezoelectric components to face a second surface of another piezoelectric component of the at least two piezoelectric components, and connecting portions of the at least two piezoelectric components are staggered along the set edge; and coupling the first surface of the connecting portion to a positive circuit board, and coupling the second surface of the connecting portion to a negative circuit board, wherein different connecting portions are coupled at different positions of the positive circuit board, and different connecting portions are coupled at different positions of the negative circuit board.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

FIG. 2-1 is a schematic diagram of a piezoelectric component according to an exemplary embodiment.

FIG. 2-2 is a schematic diagram of a piezoelectric component according to another exemplary embodiment.

DETAILED DESCRIPTION

Exemplary embodiments will be described in detail herein, and examples thereof will be illustrated in accompanying drawings. When the following description refers to the drawings, unless specified otherwise, the same numbers in different drawings represent the same or similar elements. Implementations described in the following exemplary embodiments do not represent all the implementations consistent with the present disclosure. Instead, they are only examples of devices and methods consistent with some aspects of the present disclosure detailed in the appended claims.

Terms used herein are for the purpose of describing particular embodiments only and are not intended to be limiting of the disclosure. For example, the terms "connected" or "coupled" are not limited to physical or mechanical connection, but may be electric connection regardless of direct connection or indirect connection.

In some embodiments, a piezoelectric assembly includes at least two piezoelectric components in a stacked arrangement, a positive circuit board coupled to a positive electrode of the piezoelectric components, and a negative circuit board coupled to a negative electrode of the piezoelectric components. An electric field is applied to the piezoelectric components through the positive circuit board and the negative circuit board to excite an inverse piezoelectric effect of the piezoelectric components, such that the piezoelectric components are deformed under the action of the electric field and then drives a screen to vibrate and produce sound.

However, the part where the piezoelectric components are coupled to the positive circuit board or the negative circuit board may be relatively thick, resulting in increase in the volume of the entire piezoelectric assembly and affecting the installation of the piezoelectric assemblies. In addition, the process for coupling the piezoelectric components to the circuit board may be difficult and may not be suitable for mass production.

In the light of the above considerations, embodiments of the present disclosure provide a piezoelectric assembly, an electronic device, and an assembly process for a piezoelectric assembly.

Figure 1:
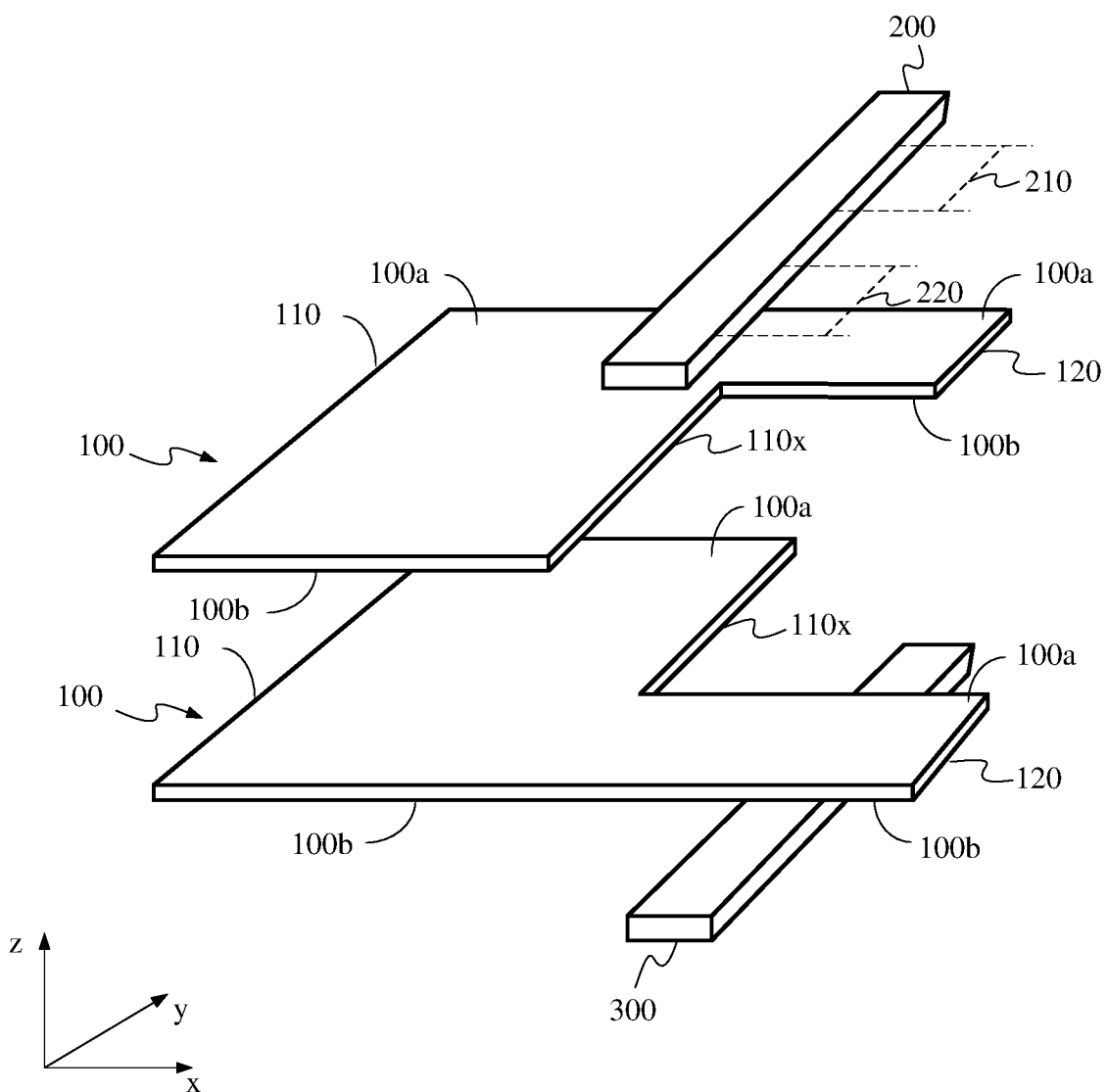
FIG. 1 is a schematic diagram of a piezoelectric assembly according to an exemplary embodiment.

FIG. 1 is a schematic diagram of a piezoelectric assembly according to an exemplary embodiment. As shown in FIG. 1, the piezoelectric assembly includes at least two piezoelectric components 100, a positive circuit board 200, and a negative circuit board 300.

Each piezoelectric component 100 includes a main body portion 110 and a connecting portion 120. A first surface 100a of the main body portion 110 and a first surface 100a of the connecting portion 120 are a positive electrode, and a second surface 100b of the main body portion 110 and a second surface 100b of the connecting portion 120 are a negative electrode. The first surfaces 100a and the second surfaces 100b are two opposite surfaces of the piezoelectric component 100. In the embodiment, the first surface 100a is an upper surface of the main body portion 110 and an upper surface of the connecting portion 120, and the second surface 100b is a lower surface of the main body portion 110 and a lower surface of the connecting portion 120.

In addition, in the main body portion 110, a piezoelectric member is provided between the positive electrode and the negative electrode. The piezoelectric member is made of materials with piezoelectric properties. For example, the materials for the piezoelectric member include polyvinylidene fluoride (pure polyvinylidene fluoride, or a mixture of polyvinylidene fluoride with zirconia, alumina, carbon nanotubes and etc.). An inverse piezoelectric effect of the piezoelectric member is excited by an electric field of the positive electrode and the negative electrode, and electrical energy is converted into mechanical energy, that is, the piezoelectric assembly realizes vibration.

Figures 1, 2:
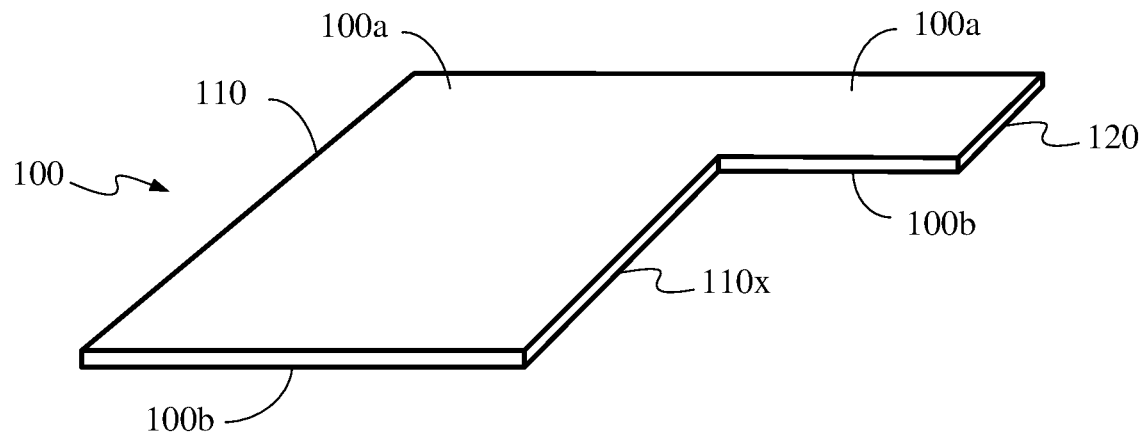
Figure 2:
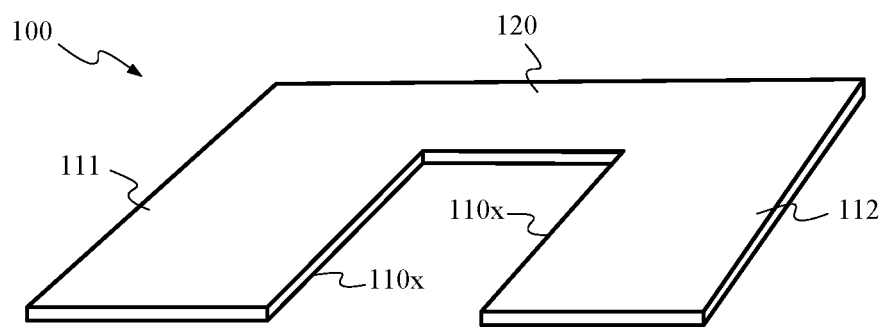

The connecting portion 120 protrudes from a set edge 110x of the main body portion 110. FIGS. 2-1 and 2-2 are schematic diagrams of piezoelectric components according to different exemplary embodiments.

In FIG. 2-1, the piezoelectric component 100 includes one main body portion 110, and in such a case, the connecting portion 120 is coupled to a set edge 110x of the main body portion 110. In FIG. 2-2, the piezoelectric component 100 includes a first main body portion 111 and a second main body portion 112, and two ends of the connecting portion 120 are coupled to a set edge 110x of the first main body portion 111 and a set edge 110x of the second main body portion 112 respectively.

In an embodiment, the piezoelectric component 100 is a complete piezoelectric thin-film component, and the main body portion 110 and the connecting portion 120 are formed by cutting, shearing or other processes. In such embodiment, the main body portion 110 and the connecting portion 120 may be a one-piece member.

Figure 3:
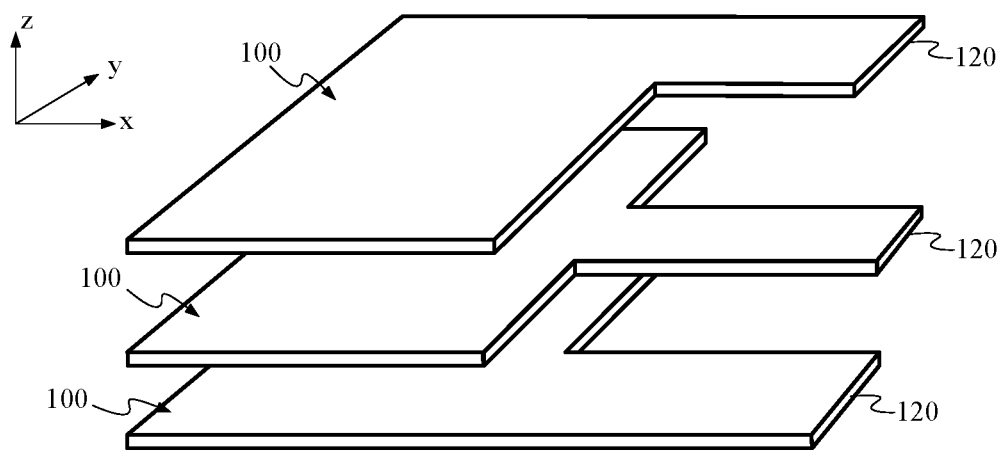
FIG. 3 is a schematic diagram of a piezoelectric assembly according to another exemplary embodiment.

FIG. 3 is a schematic diagram of a piezoelectric assembly according to another exemplary embodiment. As shown in FIGS. 1 and 3, the piezoelectric assembly includes at least two piezoelectric components 100. FIG. 1 illustrates two piezoelectric components 100, and FIG. 3 illustrates three piezoelectric components 100. The number of piezoelectric components 100 can also be 4, 5, 6, and etc.

In the piezoelectric assembly, main body portions 110 of at least two piezoelectric components 100 are stacked. In an embodiment, the main body portions 110 of adjacent piezoelectric components 100 are connected by an optical adhesive.

Moreover, in the two main body portions 110 connected, the first surface 100a of one main body portion 110 faces the second surface 100b of the other main body portion 110. In this way, in the at least two piezoelectric components 100, the orientations of the first surfaces 100a of the connecting portions 120 are the same. For example, in FIG. 1, the first surfaces 100a of the two connecting portions 120 both face upward, and the second surfaces 100b of the two connecting portions 120 both face downward.

In addition, the connecting portions 120 of at least two piezoelectric components 100 are distributed in a staggered manner along set edges 110x of the main body portions 110. In the staggered distribution, in a plane perpendicular to a thickness direction of the piezoelectric components 100, the projections of the connecting portions 120 of different piezoelectric components 100 do not overlap. In an embodiment, in different piezoelectric components 100, the distance from the connecting portion 120 to a designated end of the set edge 110x of the main body portion 110 is different.

For example, as shown in FIG. 1, in a plane defined by an x-axis and a y-axis, the projections of the connecting portions 120 of the two piezoelectric components 100 do not overlap. As shown in FIG. 3, in a plane defined by the x-axis and the y-axis, the projections of the connecting portions 120 of the three piezoelectric components 100 do not overlap.

The positive circuit board 200 is coupled to first surfaces 100a of at least two connecting portions 120, and the negative circuit board 300 is coupled to second surfaces 100b of the at least two connecting portions 120. Accordingly, a driving signal is input to the piezoelectric components 100 through the positive circuit board 200 and the negative circuit board 300 to drive the piezoelectric components 100 to vibrate. In an embodiment, the positive circuit board 200 and the negative circuit board 300 are flexible printed circuit boards (FPCB).

In this case, the orientations of the first surfaces 100a of at least two connecting portions 120 are the same, which facilitates the connection between the positive circuit board 200 and the connecting portions 120. The orientations of the second surfaces 100b of the at least two connecting portions 120 are the same, which facilitates the connection between the negative circuit board 200 and the connecting portions 120.

Moreover, at least two connecting portions 120 are distributed in the staggered manner, such that a part of the positive circuit board 200 and a part of the negative circuit board 300 within a set length range are coupled to only one connecting portion 120. For example, the positive circuit board 200 in FIG. 1 includes a first section 210 and a second section 220 along its length direction, in which the first section 210 is configured to be only coupled to the connecting portion 120 of the upper piezoelectric component 100, and the second section 220 is configured to be only coupled to the connecting portion 120 of the lower piezoelectric component 100.

At this time, a thickness at a junction where the positive circuit board 200 is coupled to the piezoelectric component 100 is a thickness at a junction where the positive circuit board 200 is coupled to one connecting portion 120. In other words, even when the piezoelectric assembly includes at least two piezoelectric components 100, the thickness at the junction between the positive circuit board 200 and the connecting portion 120 will not be increased. Similarly, a thickness at a junction where the negative circuit board 200 is coupled to the piezoelectric component 100 is always a thickness at a junction where the negative circuit board 300 is coupled to one connecting portion 120.

In the piezoelectric assembly provided by the embodiments of the present disclosure, the thickness at the junction between the piezoelectric component 100 and the circuit board (the positive circuit board 200 or the negative circuit board 300) is reduced through the staggered arrangement of the connecting portions 120. In addition, by setting the first surfaces 100a of at least two connecting portions 120 to face the same direction, and the second surfaces 100b of at least two connecting portions 120 to face the same direction, it is convenient to couple the circuit board to the connecting portion 120, simplifying the assembly process, and making the piezoelectric assembly suitable for mass production.

In an embodiment, as shown in FIG. 1, along an extension direction of the connecting portion 120, the positive circuit board 200 and the negative circuit board 300 are arranged in a staggered manner. For example, the connecting portion 120 extends along the x-axis, and at this time, the projections of the positive circuit board 200 and the negative circuit board 300 in the plane defined by the x-axis and the y-axis do not overlap. Accordingly, by the staggered arrangement of the positive circuit board 200 and the negative circuit board 300, the thickness at the junction between the circuit board and the piezoelectric assembly is further reduced.

Figure 4:
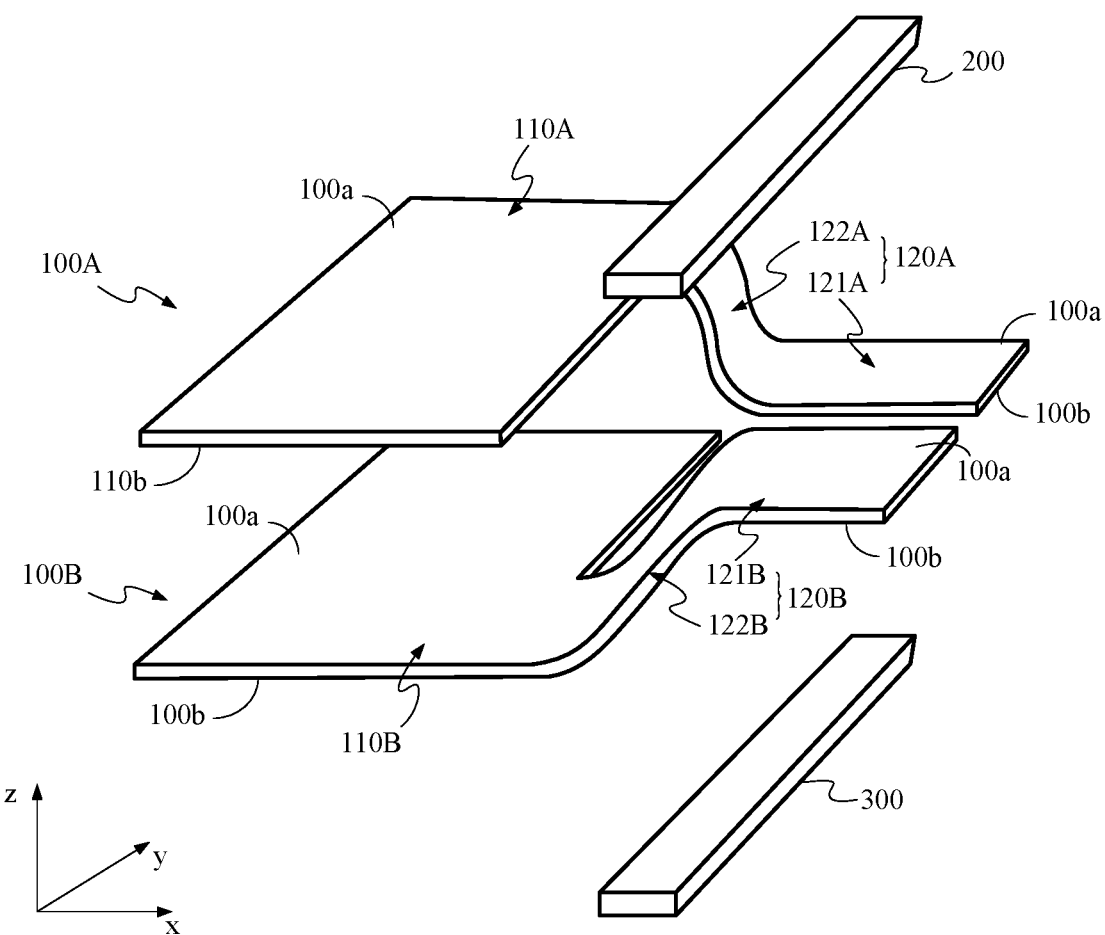
FIG. 4 is a schematic diagram of a piezoelectric assembly according to another exemplary embodiment.

FIG. 4 is a schematic diagram of a piezoelectric component according to an exemplary embodiment. As shown in FIG. 4, the connecting portion 120A/120B (collectively referred to as the connecting portion 120) in the piezoelectric component 100A/100B (collectively referred to as the piezoelectric component 100) includes a bearing section 121A/121B (collectively referred to as the bearing section 121) and a bending section 122A/122B (collectively referred to as the bending section 122).

A first surface 100a of the bearing section 121 is a positive electrode, and the first surface 100a of the bearing section 121 is configured to couple a positive circuit board 200. A second surface 100b of the bearing section 121 is a negative electrode, and the second surface 100b of the bearing section 121 is configured to couple a negative circuit board 300.

The bending section 122 is connected to the bearing section 121. In an embodiment, the bending section 122 includes a curved surface or at least one inclined surface. Bending directions of bending sections 122 are configured such that bearing sections 121 of at least two piezoelectric components 100 approach each other along a thickness direction of the connecting portions 120 (i.e., the z-axis). In this way, the height difference between the junctions between the bearing sections 121 of different connecting portions 120 and the circuit boards (the positive circuit board 200 and the negative circuit board 300) is reduced.

In an embodiment, in any two piezoelectric components, a distance between the first surfaces 100a of the bearing sections 121 is less than or equal to a set threshold. For example, the set threshold is 1 mm, 1.5 mm, 2 mm or etc. Accordingly, the bearing sections 121 of different connecting portions 120 can be coupled to one surface of the circuit board. In this way, the structural thicknesses at the junctions between the connecting portions 120 and the positive circuit board 200 and between the connecting portions 120 and the negative circuit board 300 can be reduced, and the volume at the junctions between the connecting portions 120 and the circuit boards is further decreased.

In the embodiments of the present disclosure, the bearing section 121 and the bending section 122 can be implemented in various ways. Hereinafter, a piezoelectric assembly including two piezoelectric components 100 is taken as an example for description.

In a first implementation, as shown in FIG. 4, the piezoelectric assembly includes a first piezoelectric component 100A and a second piezoelectric component 100B. A main body portion 110A of the first piezoelectric component 100A is arranged above a main body portion 110B of the second piezoelectric component 100B.

A bending section of the first piezoelectric component 100A includes a first bending section 122A, and a bearing section of the first piezoelectric component 100A includes a first bearing section 121A. The first bending section 122A and the first bearing section 121A are connected sequentially from a set edge of the main body portion 110A.

A bending section of the second piezoelectric component 100B includes a second bending section 122B, and a bearing section of the second piezoelectric component 100B includes a second bearing section 121B. The second bending section 122B and the second bearing section 121B are connected sequentially from a set edge of the main body portion 110B.

The bending directions of the first bending section 122A and the second bending section 122B are opposite, such that a distance between a first surface 100a of the first bearing section 121A and a first surface 100a of the second bearing section 121B is less than or equal to a set threshold. For example, as shown in FIG. 4, the first bending section 122A bends downward, and the second bending section 122B bends upward, such that the first bearing section 121A and the second bearing section 121B approach each other.

In an embodiment, bending curvatures and lengths of the first bending section 122A and the second bending section 122B satisfy that the first surface 100a of the first bearing section 121A and the first surface 100a of the second bearing section 121B are flush, and a second surface 100b of the first bearing section 121A and a second surface 100b of the second bearing section 121B are flush.

In this implementation, the first bearing section 121A and the second bearing section 121B are configured to couple a positive circuit board 200 and a negative circuit board 300. Specifically, the first surface 100a of the first bearing section 121A and the first surface 100a of the second bearing section 121B are configured to couple the positive circuit board 200, while the second surface 100b of the first bearing section 121A and the second surface 100b of the second bearing section 121B are configured to couple the negative circuit board 300.

In this way, with the first bending section 122A and the second bending section 122B, in a thickness direction (z-axis), the first bearing section 121A and the second bearing section 121B converge in a middle position of the piezoelectric assembly, such that the thicknesses at the junctions between the piezoelectric component 100 and the positive circuit board 200, also between the piezoelectric component 100 and the negative circuit board 300 are reduced.

Figure 5:
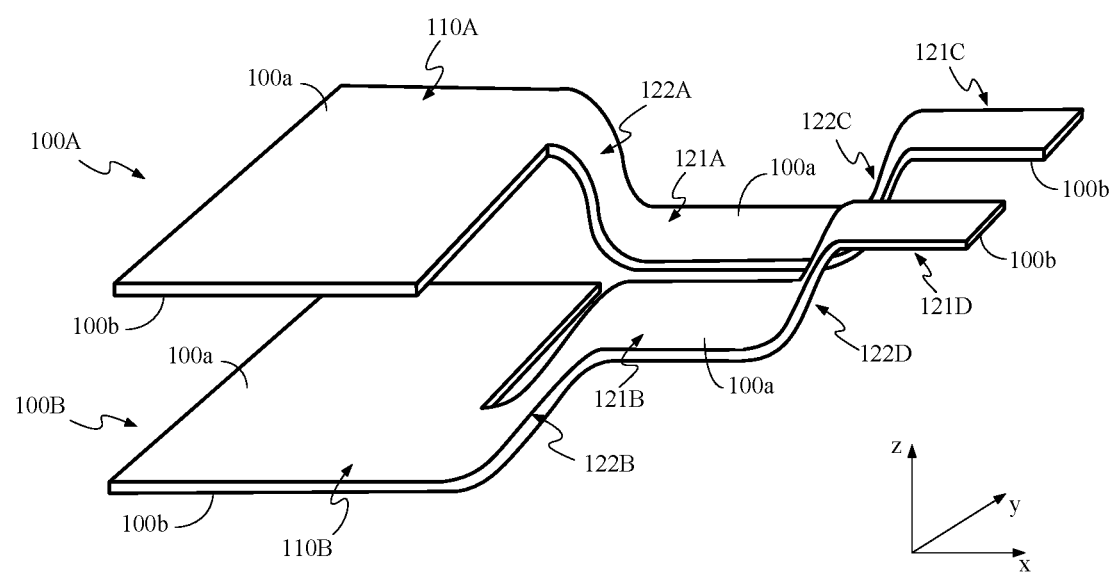
FIG. 5 is a schematic diagram of a piezoelectric assembly according to another exemplary embodiment.

As a second implementation, FIG. 5 is a schematic diagram of a piezoelectric component in a piezoelectric assembly according to an exemplary embodiment. The second implementation is an improvement based on the first implementation. The first bearing section 121A and the second bearing section 121B are coupled to one of a positive circuit board 200 and a negative circuit board 300. As shown in FIG. 5, the first surface 100a of the first bearing section 121A and the first surface 100a of the second bearing section 121B are coupled to the positive circuit board.

In the second implementation, the bending section of the first piezoelectric component 100A further includes a third bending section 122C, and the bearing section of the first piezoelectric component 100A further includes a third bearing section 121C. The third bending section 122C and the third bearing section 121C are connected sequentially from an end of the first bearing section 121A away from the first bending section 122A.

The bending section of the second piezoelectric component 100B further includes a fourth bending section 122D, and the bearing section of the second piezoelectric component 100B further includes a fourth bearing section 121D. The fourth bending section 122D and the fourth bearing section 121D are connected sequentially from an end of the second bearing section 121B away from the second bending section 122B.

The bending directions of the third bending section 122C and the fourth bending section 122D are the same. As shown in FIG. 5, the third bending section 122C and the fourth bending section 122D are bent upward. In this way, heights of the third bearing section 121C and the fourth bearing section 121D are raised. A second surface 100b of the third bearing section 121C and a second surface 100b of the fourth bearing section 121D are coupled to the negative circuit board.

In addition to the way as shown in FIG. 5, the second surface 100b of the first bearing section 121A and the second surface 100b of the second bearing section 121B may be coupled to the negative circuit board. In such case, the third bending section 122C and the fourth bending section 122D are bent downward to reduce the heights of the third bearing section 121C and the fourth bearing section 121D. A first surface 100a of the third bearing section 121C and a first surface 100a of the fourth bearing section 121D are coupled to the positive circuit board.

That is, the first bearing section 121A and the second bearing section 121B are coupled to one of the positive circuit board and the negative circuit board, while the third bearing section 121C and the fourth bearing section 121D are coupled to the other of the positive circuit board and the negative circuit board.

In this implementation, one piezoelectric component 100 is coupled to the positive circuit board and the negative circuit board by different bearing sections (121C, 121D) correspondingly. In addition, with the third bending section 122C and the fourth bending section 122D, the positions of the third bearing section 121C and the fourth bearing section 121D are changed in a thickness direction (z-axis), thereby providing installation space for the circuit boards.

In this way, in the thickness direction (z-axis), the positive circuit board and the negative circuit board will not exceed an upper surface of the main body portion 110A and a lower surface of the main body portion 110B, effectively reducing the thicknesses at the junctions between the connecting portions 120 and the circuit boards, i.e. the positive circuit board and the negative circuit board.

Figure 6:
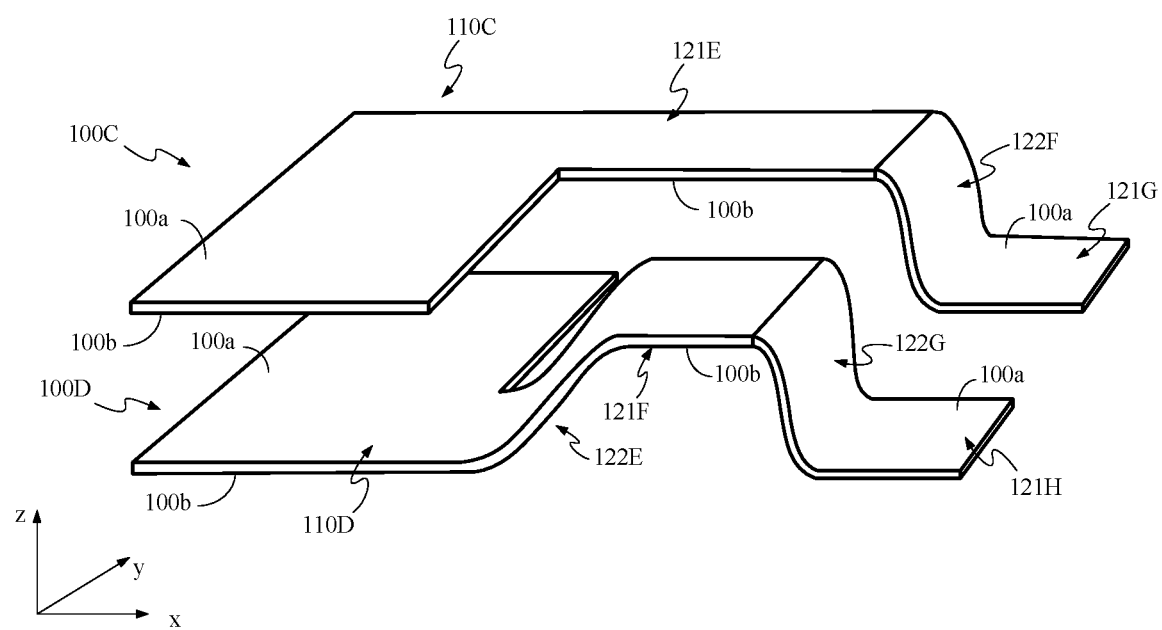
FIG. 6 is a schematic diagram of a piezoelectric assembly according to another exemplary embodiment.

As a third implementation, FIG. 6 is a schematic diagram of a piezoelectric component in a piezoelectric assembly according to an exemplary embodiment. As shown in FIG. 6, the piezoelectric assembly includes a third piezoelectric component 100C and a fourth piezoelectric component 100D. A main body portion 110C of the third piezoelectric component 100C is arranged above a main body portion 110D of the fourth piezoelectric component 100D.

A bearing section of the third piezoelectric component 100C includes a fifth bearing section 121E connected to a set edge of the main body portion 110C. A bending section of the fourth piezoelectric component 100D includes a fifth bending section 122E, and a bearing section of the fourth piezoelectric component 100D includes a sixth bearing section 121F. The fifth bending section 122E and the sixth bearing section 121F are connected sequentially from a set edge of the main body portion 110D.

A bending direction of the fifth bending section 122E is configured in such a way that a distance between a first surface 100a of the sixth bearing section 121F and a first surface 100a of the fifth bearing section 121E is less than or equal to a set threshold. As shown in FIG. 6, the fifth bending section 122E bends upward, such that the sixth bearing section 121F approaches the fifth bearing section 121E. For instance, with the fifth bending section 122E, the sixth bearing section 121F does not exceed an upper surface of the main body portion 110C of the third piezoelectric component 100C.

The fifth bearing section 121E and the sixth bearing section 121F are coupled to one of a positive circuit board and a negative circuit board. In an embodiment, the fifth bearing section 121E and the sixth bearing section 121F are coupled to the positive circuit board. The main body portion 110C of the third piezoelectric component 100C is arranged above the main body portion 110D of the fourth piezoelectric component 100D. In order to prevent the circuit board from exceeding the upper surface of the main body portion 110C, for instance, a space below the fifth bearing section 121E and the sixth bearing section 121F is used. That is, second surfaces of the fifth bearing section 121E and the sixth bearing section 121F are coupled to the negative circuit board.

In addition, the bending section of the third piezoelectric component 100C further includes a sixth bending section 122F, and the bearing section of the third piezoelectric component 100C further includes a seventh bearing section 121G. The sixth bending section 122F and the seventh bearing section 121G are connected sequentially from an end of the fifth bearing section 121E away from the main body portion 110C.

The bending section of the fourth piezoelectric component 100D further includes a seventh bending section 122G, and the bearing section of the fourth piezoelectric component 100D further includes an eighth bearing section 121H. The seventh bending section 122G and the eighth bearing section 121H are connected sequentially from an end of the sixth bearing section 121F away from the fifth bending section 122E.

The bending directions of the sixth bending section 122F and the seventh bending section 122G are the same. For example, as shown in FIG. 6, the sixth bending section 122F and the seventh bending section 122G are bent downward, to reduce the heights of the seventh bearing section 121G and the eighth bearing section 121H. In such a case, there is more space above the seventh bearing section 121G and the eighth bearing section 121H, and the positive circuit board is coupled to an upper surface of the seventh bearing section 121G and an upper surface of the eighth bearing section 121H.

In this implementation, the space above or below the bearing section 121 is reasonably utilized by providing the bending section 122, and the thicknesses at the junctions between the connecting portions 120 and the positive and negative circuit boards are reduced. Moreover, in this way, the connecting portions 120 together with the positive circuit board and the negative circuit board form a braided structure, which optimizes the connection stability of them and improves the structural stability of the overall piezoelectric assembly.

The connecting portion of the third piezoelectric component 100C may bend downward first, and then the connecting portion of the fourth piezoelectric component 100D may correspondingly bend upward. At this time, the positive circuit board is arranged adjacent to the main body portion 110, and the negative circuit board is arranged away from the main body portion 110.

Figure 7:
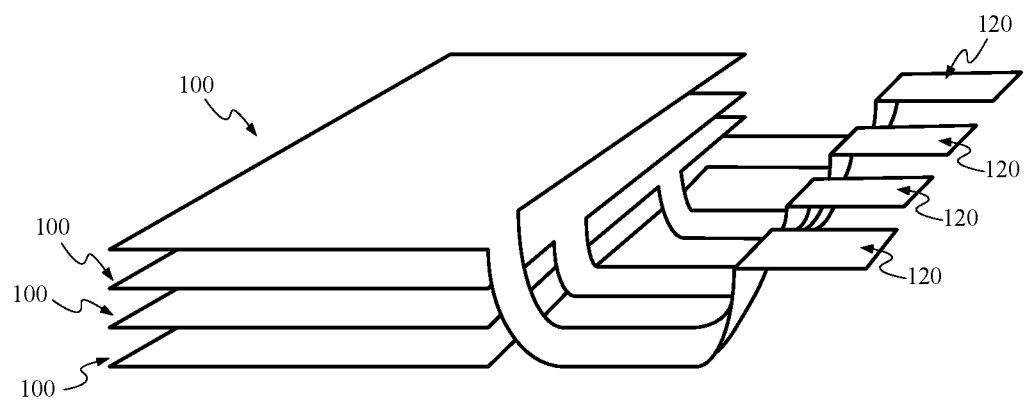
FIG. 7 is a schematic diagram of a piezoelectric assembly according to another exemplary embodiment.

In addition, in a vibration module having more than two piezoelectric components 100, the arrangement of the connecting portions 120 of the piezoelectric components 100 can also refer to the above three implementations. FIG. 7 is a schematic diagram of a piezoelectric component in a piezoelectric assembly according to an exemplary embodiment.

As shown in FIG. 7, in an order from top to bottom, connecting portions 120 of top three piezoelectric components 100 are bent downward to be flush with a connecting portion 120 of the lowermost piezoelectric component 100, so as to couple the positive circuit board 200. Afterwards, the connecting portions 120 of the four piezoelectric components 100 are bent upward correspondingly to couple the negative circuit board 300.

It should be noted that FIG. 7 is merely an exemplary implementation with four piezoelectric components. A person skilled in the art can freely select and combine the above arrangements of the connecting portions 120 based on the number of piezoelectric components 100, of which the implementations belong to the present disclosure.

Embodiments of the present disclosure also provide an electronic device that includes the piezoelectric assembly described above. The electronic device may include a display screen and the piezoelectric assembly.

For the electronic device provided by the embodiments of the present disclosure, the piezoelectric assembly is small in size and easy to install, the difficulty of assembling the entire electronic device is reduced effectively, and a light and thin design of the electronic device can be realized.

In an embodiment, the electronic device further includes a display screen, and the piezoelectric assembly is coupled to a back surface of the display screen. For example, the piezoelectric assembly is attached to the back surface of the display screen; or the piezoelectric assembly is coupled to the back surface of the display screen by other transmission members. The back surface of the display screen refers to a part of the display screen facing the inside of the electronic device. In this way, the vibration of the piezoelectric assembly drives the display screen to vibrate and produce sound. Hence, the purpose of removing sound holes from the electronic device is achieved.

In an embodiment, the electronic device further includes a middle frame, and the middle frame is configured to fix the display screen. The piezoelectric assembly is attached to the middle frame. In this way, the vibration of the piezoelectric assembly drives the middle frame to vibrate and produce sound. Likewise, the purpose of removing sound holes from the electronic device is achieved.

In addition, in the embodiments of the present disclosure, the electronic device includes, but is not limited to: a mobile phone, a tablet computer, a wearable device (a smart watch, a smart bracelet, etc.), a vehicle-mounted device, and a medical device.

Embodiments of the present disclosure also provide an assembly process for a piezoelectric assembly. The assembly process is used to process the piezoelectric assembly described above.

Figure 8:
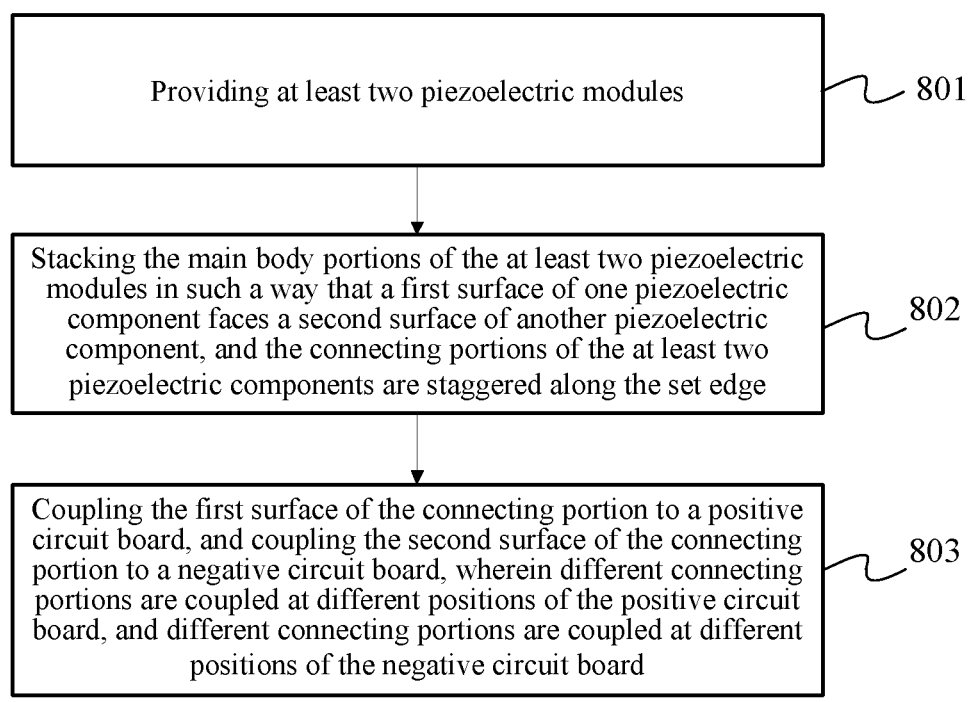
FIG. 8 is a flow chart of an assembly process for a piezoelectric assembly according to an exemplary embodiment.

FIG. 8 is a flow chart of an assembly process for a piezoelectric assembly according to an exemplary embodiment. As shown in FIG. 8, the assembly process includes the following blocks.

In block 801, at least two piezoelectric components are provided.

Regarding the structure of the piezoelectric components, reference may be made to the embodiments described above. For example, each piezoelectric component includes a main body portion and a connecting portion; the connecting portion protrudes from a set edge of the main body portion; first surfaces of the main body portion and the connecting portion are a positive electrode, and second surfaces of the main body portion and the connecting portion are a negative electrode; the first surfaces are opposite to the second surfaces. Moreover, referring to FIGS. 2-1 and 2-2, in different piezoelectric components, the connecting portions are arranged at different positions along the set edges.

In block 802, the main body portions of at least two piezoelectric components are stacked in such a way that a first surface of one piezoelectric component faces a second surface of the other piezoelectric component, and the connecting portions of the at least two piezoelectric components are staggered along the set edge. In an embodiment, the main body portions of different piezoelectric components are connected by an optical adhesive.

In block 803, the first surfaces of the connecting portions are coupled to the positive circuit board, while the second surfaces of the connecting portions are coupled to the negative circuit board; different connecting portions are coupled at different positions of the positive circuit board, and different connecting portions are coupled at different positions of the negative circuit board.

By adopting the assembly process for the piezoelectric assembly according to the embodiments of the present disclosure, with the staggered connecting portions, a thickness at junctions between the connecting portions and the circuit board is always a thickness at a junction between the circuit board and one connecting portion. In this way, when there are at least two piezoelectric components, the thickness at the junction between the connecting portions and the circuit board is reduced. Moreover, the positive circuit board is coupled to the first surfaces of the connecting portions, and the negative circuit board is coupled to the second surfaces of the connecting portions. The process is simple and easy to operate, and is suitable for mass production of piezoelectric assemblies.

In an embodiment, the piezoelectric component is a flexible component. For example, the piezoelectric component is a thin film piezoelectric component. At this time, before the action in block 803, the process further includes: bending the connecting portion such that a distance between the first surfaces of the connecting portions of any two piezoelectric components after bending is less than or equal to a set threshold.

In this way, the connecting portions of any two piezoelectric components approach each other in the thickness direction of the piezoelectric assembly, and the thickness at the junction between the connecting portions and the circuit board is further reduced.

In the embodiments of the present disclosure, the bending of the piezoelectric component and the action in block 803 can be implemented in various ways, which will be described below in different examples.

In a first example, the at least two piezoelectric components include a first piezoelectric component and a second piezoelectric component. In such a case, bending the connecting portion specifically includes: bending connecting portion of the first piezoelectric component and bending connecting portion of the second piezoelectric component in opposite directions for the first time, such that after the bending for the first time a distance between a first surface of the connecting portion of the first piezoelectric component and a first surface of the connecting portion of the second piezoelectric component is less than or equal to a set threshold.

Based on the embodiment shown in FIG. 4, the connecting portion of the first piezoelectric component bends downward, and the connecting portion of the second piezoelectric component bends upward. In this way, the connecting portions of the first piezoelectric component and the second piezoelectric component converge toward a middle position in the thickness direction of the piezoelectric assembly. Thus, the overall thickness at the junction between the connecting portions and the circuit board is further reduced.

Based on an action of bending the connecting portion, the action in block 803 can be implemented in two ways.

In an embodiment, the action in block 803 includes: after the bending for the first time, coupling the first surface of the connecting portion of the first piezoelectric component and the first surface of the connecting portion of the second piezoelectric component to the positive circuit board, and coupling the second surface of the connecting portion of the first piezoelectric component and the second surface of the connecting portion of the second piezoelectric component to the negative circuit board.

Figure 9:
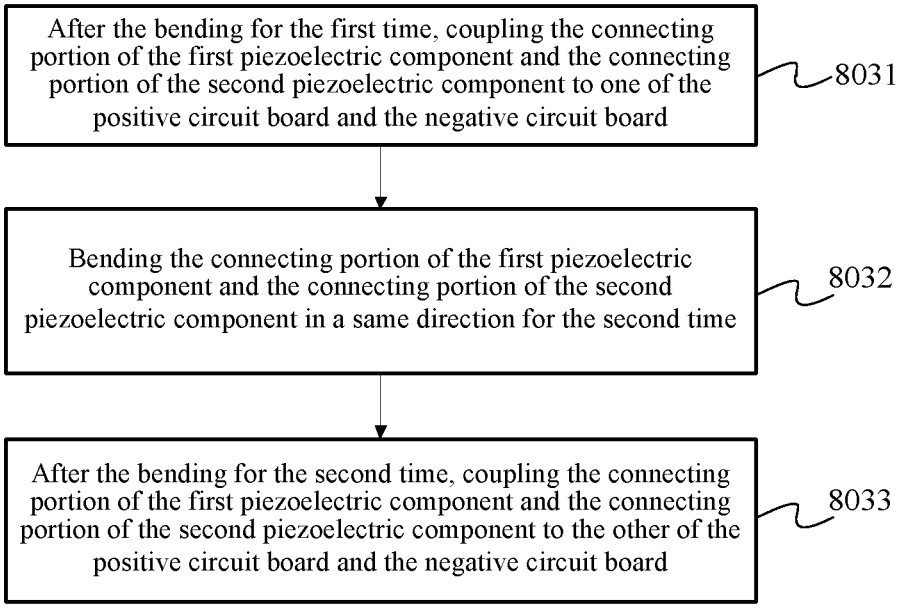
FIG. 9 is a flow chart of an assembly process for a piezoelectric assembly according to another exemplary embodiment.

FIG. 9 is a flow chart of an assembly process for a piezoelectric assembly according to another exemplary embodiment. As shown in FIG. 9, the action in block 803 includes the following.

In block 8031, after the bending for the first time, the connecting portions of the first piezoelectric component and the second piezoelectric component are coupled to one of the positive circuit board and the negative circuit board.

Based on the embodiment shown in FIG. 5, after the bending for the first time, the first surfaces of respective connecting portions of the first piezoelectric component and the second piezoelectric component are coupled to the positive circuit board.

In block 8032, the connecting portions of the first piezoelectric component and the second piezoelectric component are bent in the same direction for the second time.

Based on the embodiment shown in FIG. 5, the connecting portions of the first piezoelectric component and the second piezoelectric component are bent upward.

In block 8033, after the bending for the second time, the connecting portions of the first piezoelectric component and the second piezoelectric component are coupled to the other of the positive circuit board and the negative circuit board.

Based on the embodiment shown in FIG. 5, after the bending for the second time, the second surfaces of respective connecting portions of the first piezoelectric component and the second piezoelectric component are coupled to the negative circuit board. It can be seen that, through the second bending in block 8032, the connecting portions of the first piezoelectric component and the second piezoelectric component are raised to provide space for mounting the negative circuit board.

In an embodiment, in block 8031, the second surfaces of the connecting portions of the first piezoelectric component and the second piezoelectric component are coupled to the negative circuit board. In block 8031, the connecting portions of the first piezoelectric component and the second piezoelectric component are bent downward. In block 8033, after the bending for the second time, the first surfaces of the connecting portions of the first piezoelectric component and the second piezoelectric component are coupled to the positive circuit board.

In a second example, the at least two piezoelectric components include a third piezoelectric component and a fourth piezoelectric component. In such a case, bending the connecting portion specifically includes: bending a connecting portion of the fourth piezoelectric component for the first time, such that a distance between a first surface of the connecting portion of the fourth piezoelectric component and a first surface of a connecting portion of the third piezoelectric component is less than or equal to a set threshold. In this way, the connecting portion of the first piezoelectric component approaches the connecting portion of the third piezoelectric component.

Figure 10:
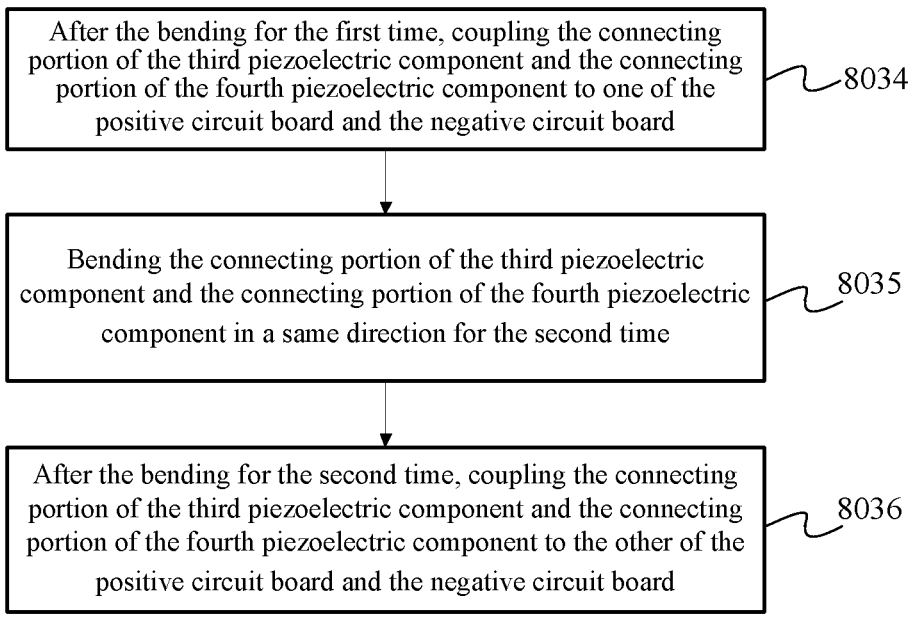
FIG. 10 is a flow chart of an assembly process for a piezoelectric assembly according to another exemplary embodiment.

FIG. 10 is a flow chart of an assembly process for a piezoelectric assembly according to another exemplary embodiment. As shown in FIG. 10, the action in block 803 includes the following.

In block 8034, after the bending for the first time, respective connecting portions of the third piezoelectric component and the fourth piezoelectric component are coupled to one of the positive circuit board and the negative circuit board.

Based on the embodiment shown in FIG. 6, second surfaces of the connecting portions of the third piezoelectric component and the fourth piezoelectric component are coupled to the negative circuit board.

In block 8035, the connecting portions of the third piezoelectric component and the fourth piezoelectric component are bent in the same direction for the second time.

Based on the embodiment shown in FIG. 6, the connecting portions of the third piezoelectric component and the fourth piezoelectric component are bent downward.

In block 8036, after the bending for the second time, the connecting portions of the third piezoelectric component and the fourth piezoelectric component are coupled to the other of the positive circuit board and the negative circuit board.

Based on the embodiment shown in FIG. 6, the first surfaces of the connecting portions of the third piezoelectric component and the fourth piezoelectric component are coupled to the positive circuit board.

In an embodiment, in block 803, along an extension direction of the connecting portion, a junction position between the positive circuit board and the first surface is offset from a junction position between the negative circuit board and the second surface. That is, along the extension direction of the connecting portion, the junction position between the positive circuit board and the first surface and the junction position between the negative circuit board and the second surface are staggered. Accordingly, the thicknesses at the junctions between the positive and negative circuit boards and the connecting portions are reduced.

It should be noted that the foregoing embodiments do not limit the number of piezoelectric components. When the piezoelectric assembly includes more than two piezoelectric components, the assembly process is similar to the process blocks described above.

By means of the assembly process for the piezoelectric assembly according to the embodiments of the present disclosure, the thickness at the junction between the piezoelectric component and the circuit board in the assembled piezoelectric assembly can be reduced effectively, the volume of the overall piezoelectric assembly can be decreased, and moreover, the overall process is simple and easy to operate, which is suitable for mass production of piezoelectric assemblies.

Other embodiments of the present disclosure will be apparent to those skilled in the art from consideration of the specification and practice of the present disclosure. This application is intended to cover any variations, uses, or adaptations of the present disclosure, which are in accordance with the general principles of the present disclosure and include common knowledge or conventional technical means in the art that are not disclosed herein. The specification and embodiments are considered to be exemplary only, and the true scope of the present disclosure is indicated by the following claims.

What is claimed is:

1. A piezoelectric assembly, comprising:
   at least two piezoelectric components, each of the at least two piezoelectric components comprising:
   a main body portion having a set edge, a first surface, and a second surface opposite the first surface, main body portions of the at least two piezoelectric components being stacked, and
   a connecting portion protruding from the set edge and having a first surface and a second surface opposite the first surface, the first surface of the main body portion and the first surface of the connecting portion being a positive electrode, the second surface of the main body portion and the second surface of the connecting portion being a negative electrode, first surfaces of connecting portions of the at least two piezoelectric components face a same direction, and the connecting portions of the at least two piezoelectric components being staggered along the set edge;
   a positive circuit board coupled to the first surface of the connecting portion; and
   a negative circuit board coupled to the second surface of the connecting portion.

2. The piezoelectric assembly according to claim 1, wherein the connecting portion comprises:
   a bearing section having a first surface as the positive electrode and a second surface as the negative electrode; and
   a bending section coupled to the bearing section,
   wherein a bending direction of the bending section causes bearing sections of the at least two piezoelectric components to approach each other in a thickness direction of the connecting portions of the at least two piezoelectric components.

3. The piezoelectric assembly according to claim 2, wherein in any two piezoelectric components of the at least two piezoelectric components, a distance between first surfaces of the bearing sections is less than or equal to a set threshold.

4. The piezoelectric assembly according to claim 2, wherein the at least two piezoelectric components comprise a first piezoelectric component and a second piezoelectric component;
   a bending section of the first piezoelectric component comprises a first bending section, a bearing section of the first piezoelectric component comprises a first bearing section, and the first bending section and the first bearing section are connected sequentially from the set edge;
   a bending section of the second piezoelectric component comprises a second bending section, a bearing section of the second piezoelectric component comprises a second bearing section, and the second bending section and the second bearing section are connected sequentially from the set edge; and
   the first bending section and the second bending section are bent in opposite directions, and a distance between a first surface of the first bearing section and a first surface of the second bearing section is less than or equal to a set threshold.

5. The piezoelectric assembly according to claim 4, wherein the first bearing section and the second bearing section are coupled to the positive circuit board and the negative circuit board; or
   the first bearing section and the second bearing section are coupled to one of the positive circuit board and the negative circuit board.

6. The piezoelectric assembly according to claim 5, wherein the bending section of the first piezoelectric component comprises a third bending section, the bearing section of the first piezoelectric component further comprises a third bearing section, and the third bending section and the third bearing section are connected sequentially from an end of the first bearing section away from the first bending section;
   the bending section of the second piezoelectric component comprises a fourth bending section, the bearing section of the second piezoelectric component comprises a fourth bearing section, and the fourth bending section and the fourth bearing section are connected sequentially from an end of the second bearing section away from the second bending section;
the third bending section and the fourth bending section are bent in a same direction; and
the first bearing section and the second bearing section are configured to couple one of the positive circuit board and the negative circuit board, and the third bearing section and the fourth bearing section are configured to couple the other of the positive circuit board and the negative circuit board.

7. The piezoelectric assembly according to claim 2, wherein the at least two piezoelectric components comprise a third piezoelectric component and a fourth piezoelectric component;
   a bearing section of the third piezoelectric component comprises a fifth bearing section coupled to the set edge;
   a bending section of the fourth piezoelectric component comprises a fifth bending section, a bearing section of the fourth piezoelectric component comprises a sixth bearing section, and the fifth bending section and the sixth bearing section are connected sequentially from the set edge; and
   a bending direction of the fifth bending section is configured in such a way that a distance between a first surface of the sixth bearing section and a first surface of the fifth bearing section is less than or equal to a set threshold; and the fifth bearing section and the sixth bearing section are coupled to the positive circuit board or the negative circuit board.

8. The piezoelectric assembly according to claim 7, wherein the bending section of the third piezoelectric component further comprises a sixth bending section, the bearing section of the third piezoelectric component further comprises a seventh bearing section, and the sixth bending section and the seventh bearing section are connected sequentially from an end of the fifth bearing section away from the set edge;
   the bending section of the fourth piezoelectric component further comprises a seventh bending section, the bearing section of the fourth piezoelectric component further comprises an eighth bearing section, and the seventh bending section and the eighth bearing section are connected sequentially from an end of the sixth bearing section away from the fifth bending section; and
   the sixth bending section and the seventh bending section are bent in a same direction, and the seventh bearing section and the eighth bearing section are coupled to the positive circuit board or the negative circuit board.

9. The piezoelectric assembly according to claim 1, wherein along an extension direction of the connecting portion, the positive circuit board and the negative circuit board are arranged in a staggered manner.

10. The piezoelectric assembly according to claim 1, wherein the piezoelectric component comprises a first main body portion and a second main body portion, and two ends of the connecting portion are connected to the first main body portion and the second main body portion respectively.

11. An electronic device, comprising:
   a display screen having a back surface facing an inside of the electronic device; and
   a piezoelectric assembly coupled to the back surface and comprising:
      at least two piezoelectric components, each of the at least two piezoelectric components comprising:
         a main body portion having a set edge, a first surface, and a second surface opposite the first surface, main body portions of the at least two piezoelectric components being stacked, and
         a connecting portion extending from the set edge in a direction away from the main body portion and having a first surface and a second surface opposite the first surface, the first surface of the main body portion and the first surface of the connecting portion being a positive electrode, the second surface of the main body portion and the second surface of the connecting portion being a negative electrode, first surfaces of connecting portions of the at least two piezoelectric components face a same direction, and the connecting portions of the at least two piezoelectric components being spaced apart along the set edge;
      a positive circuit board arranged on the first surface of the connecting portion; and
      a negative circuit board arranged on the second surface of the connecting portion.

12. The electronic device according to claim 11, further comprising a middle frame, configured to fix the display screen, and the piezoelectric assembly is attached to the middle frame.

13. An assembly process for a piezoelectric assembly, comprising:
   providing at least two piezoelectric components, wherein each of the at least two piezoelectric components comprises a main body portion and a connecting portion protruding from a set edge of the main body portion; a first surface of the main body portion and a first surface of the connecting portion are a positive electrode, and a second surface of the main body portion and a second surface of the connecting portion are a negative electrode; the first surfaces are opposite to the second surfaces;
   stacking main body portions of the at least two piezoelectric components to cause a first surface of one piezoelectric component of the at least two piezoelectric components to face a second surface of another piezoelectric component of the at least two piezoelectric components, and connecting portions of the at least two piezoelectric components are staggered along the set edge; and
   coupling the first surface of the connecting portion to a positive circuit board and coupling the second surface of the connecting portion to a negative circuit board, wherein different connecting portions are coupled at different positions of the positive circuit board, and different connecting portions are coupled at different positions of the negative circuit board.

14. The assembly process according to claim 13, wherein before the coupling the first surface of the connecting portion to a positive circuit board and coupling the second surface of the connecting portion to a negative circuit board, the assembly process further comprises:
   bending the connecting portion to cause a distance between the first surfaces of the connecting portions of any two piezoelectric components of the at least two piezoelectric components after bending to be less than or equal to a set threshold.

15. The assembly process according to claim 14, wherein the at least two piezoelectric components comprise a first piezoelectric component and a second piezoelectric component;
   the bending the connecting portion comprises: bending a connecting portion of the first piezoelectric component and a connecting portion of the second piezoelectric component in opposite directions for a first time, to cause a distance between a first surface of the connecting portion of the first piezoelectric component and a first surface of the connecting portion of the second piezoelectric component to be less than or equal to the set threshold.

16. The assembly process according to claim 15, wherein the coupling the first surface of the connecting portion to a positive circuit board and coupling the second surface of the connecting portion to a negative circuit board comprises:

after the bending for the first time, coupling the first surface of the connecting portion of the first piezoelectric component and the first surface of the connecting portion of the second piezoelectric component to the positive circuit board, and coupling a second surface of the connecting portion of the first piezoelectric component and a second surface of the connecting portion of the second piezoelectric component to the negative circuit board.

17. The assembly process according to claim 15, wherein the coupling the first surface of the connecting portion to a positive circuit board and coupling the second surface of the connecting portion to a negative circuit board comprises:

after the bending for the first time, coupling the connecting portion of the first piezoelectric component and the connecting portion of the second piezoelectric component to one of the positive circuit board and the negative circuit board;

bending the connecting portion of the first piezoelectric component and the connecting portion of the second piezoelectric component in a same direction for a second time;

after the bending for the second time, coupling the connecting portion of the first piezoelectric component and the connecting portion of the second piezoelectric component to the other of the positive circuit board and the negative circuit board.

18. The assembly process according to claim 14, wherein the at least two piezoelectric components comprise a third piezoelectric component and a fourth piezoelectric component;

the bending the connecting portion comprises: bending a connecting portion of the fourth piezoelectric component for a first time, to cause a distance between a first surface of the connecting portion of the fourth piezoelectric component and a first surface of a connecting portion of the third piezoelectric component to be less than or equal to a set threshold.

19. The assembly process according to claim 18, wherein the coupling the first surface of the connecting portion to a positive circuit board and coupling the second surface of the connecting portion to a negative circuit board comprises:

after the bending for the first time, coupling the connecting portion of the third piezoelectric component and the connecting portion of the fourth piezoelectric component to one of the positive circuit board and the negative circuit board;

bending the connecting portion of the third piezoelectric component and the connecting portion of the fourth piezoelectric component in a same direction for a second time;

after the bending for the second time, coupling the connecting portion of the third piezoelectric component and the connecting portion of the fourth piezoelectric component to the other of the positive circuit board and the negative circuit board.

20. The assembly process according to claim 13, wherein along an extension direction of the connecting portion, a junction position between the positive circuit board and the first surface and a junction position between the negative circuit board and the second surface are staggered.

* * * * *